(12) United States Patent
Chen et al.

(10) Patent No.: US 11,626,845 B2
(45) Date of Patent: Apr. 11, 2023

(54) OPERATIONAL AMPLIFIER BASED ON METAL-OXIDE TFT, CHIP, AND METHOD

(71) Applicant: South China University of Technology, Guangzhou (CN)

(72) Inventors: Rongsheng Chen, Guangzhou (CN); Mingzhu Wen, Guangzhou (CN); Yuming Xu, Guangzhou (CN); Hui Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 8 days.

(21) Appl. No.: 17/385,020

(22) Filed: Jul. 26, 2021

(65) Prior Publication Data

US 2022/0116001 A1 Apr. 14, 2022

(30) Foreign Application Priority Data

Oct. 13, 2020 (CN) .......................... 202011089541.8

(51) Int. Cl.
*H03F 3/45* (2006.01)
*H03F 1/02* (2006.01)
*H03F 1/08* (2006.01)

(52) U.S. Cl.
CPC ....... *H03F 3/45179* (2013.01); *H03F 1/0233* (2013.01); *H03F 1/086* (2013.01)

(58) Field of Classification Search
CPC ...... H03F 1/0233; H03F 1/086; H03F 1/0205; H03F 1/38; H03F 3/45179; H03F 3/45183; H03F 3/04; H03F 2203/45318; H03F 2203/45364
USPC ........................................ 330/252, 253, 254
See application file for complete search history.

(56) References Cited

U.S. PATENT DOCUMENTS 7,138,865 B1 * 11/2006 Murden, II ......... H03F 3/45659
330/252

\* cited by examiner

*Primary Examiner* — Hafizur Rahman
*Assistant Examiner* — Khiem D Nguyen
(74) *Attorney, Agent, or Firm* — Epstein Drangel LLP; Robert L. Epstein

(57) ABSTRACT

Disclosed is an operational amplifier based on a metal-oxide TFT. The operational amplifier includes an auxiliary amplifier and a bootstrap gain-increasing amplifier. The auxiliary amplifier adopts a two-stage positive feedback structure, including a fifth transistor, a seventh transistor, an eleventh transistor, a first amplifying unit, and a second amplifying unit. A gate of the fifth transistor serves as an input end of the operational amplifier. The bootstrap gain-increasing amplifier includes two second circuits in mutual symmetry. Each of the second circuits includes a first transistor, a second transistor, and a current source unit with a bootstrap structure.

11 Claims, 3 Drawing Sheets

OPERATIONAL AMPLIFIER BASED ON METAL-OXIDE TFT, CHIP, AND METHOD

CROSS-REFERENCE TO RELATED APPLICATION

This application claims priority to Chinese patent application No. 202011089541.8, filed Oct. 13, 2020, the content of which is incorporated herein by reference in its entirety.

TECHNICAL FIELD

The present disclosure relates to the technical field of design of integrated circuits, and in particular, to an operational amplifier based on a metal-oxide TFT, a chip, and a method.

BACKGROUND

Metal-oxide thin film transistors (TFTs) are deemed as a promising technology in integrated circuits due to their high mobility, high stability, simple manufacturing process and other advantages. In recent years, the metal-oxide TFTs are widely applied to integrated circuits (IC), display drivers, converters or RFID/NFC tags. Moreover, they are also applied to a bio-electricity signal monitoring system. An operational amplifier is the most important module for amplifying signals in an analog circuit.

However, only N-type metal-oxide TFTs can be integrated, and no conventional CMOS circuit structure can be used, so great challenges are faced with in the design of operational amplifiers. First of all, because the mobility of metal oxides is far less than that of crystalline silicon, the transconductance of the metal-oxide TFTs is not high enough. Secondly, in the design of the operational amplifier, due to the lack of P-type TFTs, it is difficult to implement a high output impedance. To solve the problem that the gain of the metal-oxide TFTs is not high, positive feedback and pseudo-CMOS and other technologies are used to improve the gain of the operational amplifier, but this problem cannot be solved very well.

SUMMARY

To solve one of the technical problems in the existing technology to at least a certain extent, an objective of the present disclosure is to provide an operational amplifier based on a metal-oxide TFT, a chip, and a method. The operational amplifier uses a bootstrap gain-increasing technology, and an auxiliary amplifier adopts a two-stage positive feedback structure, solving the problem that existing TFT operational amplifiers are generally not high in gain and phase margin.

The technical solution adopted by the present disclosure is as below.

An operational amplifier based on a metal-oxide TFT includes:

an auxiliary amplifier, including two first circuits in mutual symmetry, and each of the first circuits adopt a two-stage positive feedback structure and includes a fifth transistor, a seventh transistor, an eleventh transistor, a first amplifying unit, and a second amplifying unit, with a gate of the fifth transistor being serving as an input end of the operational amplifier, a drain of the fifth transistor being connected to a source of the seventh transistor, a drain of the eleventh transistor, an input end of the first amplifying unit and an input end of the second amplifying unit, an output end of the first amplifying unit is connected to a gate of the seventh transistor, and an output end of the second amplifying unit being connected to a gate of the eleventh transistor;

a bootstrap gain-increasing amplifier, including two second circuits in mutual symmetry, and each of the second circuits includes a first transistor, a second transistor, and a current source unit with a bootstrap structure, with a gate of the second transistor being connected to the drain of the fifth transistor, the drain of the second transistor being connected to the current source unit, a source of the second transistor being connected to a drain of the first transistor and the gate of the fifth transistor, a source of the first transistor being grounded, and the drain of the second transistor serving as an output of the operational amplifier.

Further, the current source unit includes a third transistor, a fourth transistor, and a capacitor;

a gate and a drain of the fourth transistor are both connected to a power source, a source of the fourth transistor is connected to a gate of the third transistor, a drain of the third transistor is connected to the power source, a source of the third transistor is connected to the drain of the second transistor, and the capacitor is connected between the gate and the source of the third transistor in parallel.

Further, the first circuit further includes a tenth transistor, a twelfth transistor, and a thirteenth transistor;

a gate of the tenth transistor is connected to the drain of the fifth transistor, a drain of the tenth transistor is connected to the gate of the eleventh transistor and a gate of the twelfth transistor, a drain of the twelfth transistor is connected to a source of the thirteenth transistor, a gate and a drain of the thirteenth transistor are both connected to the power source, the tenth transistor, the twelfth transistor and the thirteenth transistor constitute the first amplifying unit, the drain of the twelfth transistor serves as the output of the first amplifying unit, and the tenth transistor constitutes the second amplifying unit.

Further, the auxiliary amplifier further includes a ninth transistor and a fourteenth transistor, and the ninth transistor and the fourteenth transistor both serve as current sources;

a drain of the ninth transistor is connected to a source of the fifth transistor, a gate of the ninth transistor is connected to a first bias voltage, and a source of the ninth transistor is grounded;

a drain of the fourteenth transistor is connected to a source of the eleventh transistor and a source of the twelfth transistor, a gate of the fourteenth transistor is connected to a second bias voltage, and a source of the fourteenth transistor is grounded.

Further, a gate of the first transistor is connected to the first bias voltage.

Another technical solution adopted by the present disclosure is as below.

A chip includes the operational amplifier based on a metal-oxide TFT described above.

Another technical solution adopted by the present disclosure is as below.

A design method applied to the operational amplifier based on a metal-oxide TFT described above includes the following steps:

obtaining a plurality of process parameters of a plurality of transistors, and calculating a width-to-length ratio of all the plurality of transistors according to the plurality of process parameters;

adjusting a voltage value of bias voltage so as to make all the plurality of transistors work in a saturation region;

simulating the operational amplifier, and optimizing and adjusting the width-to-length ratio parameter of the plurality of transistors according to the simulation result.

The beneficial effects of the present disclosure include: in the present disclosure, a TFT operational amplifier circuit having a high gain and a stable phase margin is implemented using a bootstrap gain-increasing technology; and in addition, the auxiliary amplifier adopts two-stage positive feedback structures to further improve a voltage gain.

BRIEF DESCRIPTION OF DRAWINGS

To more clearly describe the technical solutions in the embodiments of the present disclosure or in the existing technology, the following introduces the accompanying drawings of related technical solutions in the embodiments of the present disclosure or in the existing technology. It should be understood that the accompanying drawings introduced below are merely intended to facilitate a clear description of some embodiments in the technical solutions of the prevent disclosure, and those skilled in the art may further acquire other accompanying drawings according to these accompanying drawings without creative effects.

DESCRIPTION OF EMBODIMENTS

Figure 1:
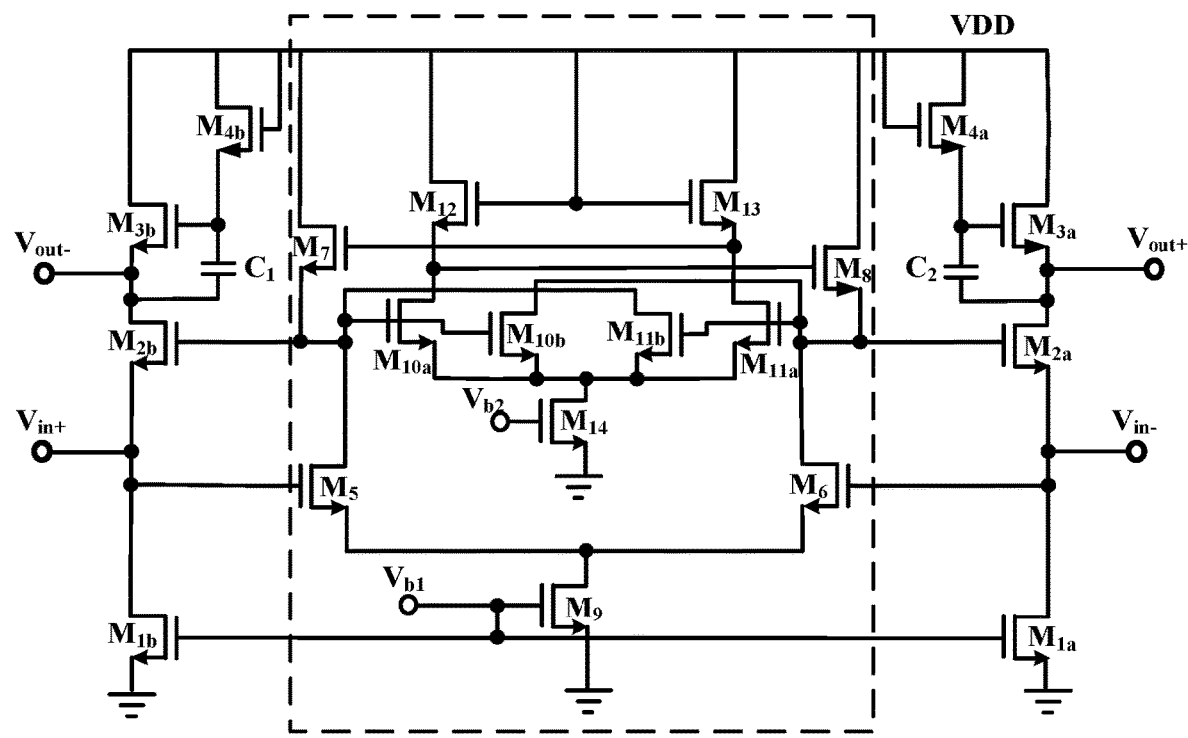
FIG. 1 is a circuit diagram of an operational amplifier based on a metal-oxide TFT in an embodiment of the present disclosure.

The embodiments of the present disclosure are described in detail below. Examples of the embodiments are illustrated in the accompanying drawings. Identical or similar reference numerals represent identical or similar elements or elements that have identical or similar functions from beginning to end. The embodiments described below with reference to the accompanying drawings are exemplary and are merely intended to interpret the present disclosure and should not be understood as limiting the present disclosure. Step numbers in the following embodiments are merely for facilitating illustration, but not intended to limit the step order. The implementation order of all the steps in the embodiments may be adjusted adaptively according to the understanding of those skilled in the art.

In the description of the present disclosure, it should be understood that the orientations or positional relationships indicated by the terms "up", "down", "front", "rear", "left", "right", etc. are based on the orientations or positional relationships shown in the accompanying drawings and are merely for ease in describing the present disclosure and simplifying this description, but not to indicate or imply that an indicated device or element must have a particular orientation and be constructed and operated in a particular orientation, and thus they should not be construed as limitations on the present disclosure.

In the description of the present disclosure, the term "several" means one or more, the term "a plurality of" means two or more, the terms "greater than", "less than", "exceed", etc. are interpreted as excluding this number, and the terms "above", "below", "within", etc. are interpreted as including this number. The terms "first" and "second", if stated, are only used to distinguish technical features, and they cannot be understood as indicating or implying relative importance or implicitly indicating the number of the technical features indicated or implicitly indicating the precedence relationship of the technical features indicated.

In the description of the present disclosure, unless otherwise specified, the words "disposal", "mount", "connect", etc. should be understood in a broad sense, and specific meanings of these words in the present disclosure may be reasonably determined by those skilled in the art in combination with the specific contents of the technical solutions.

Figure 2:
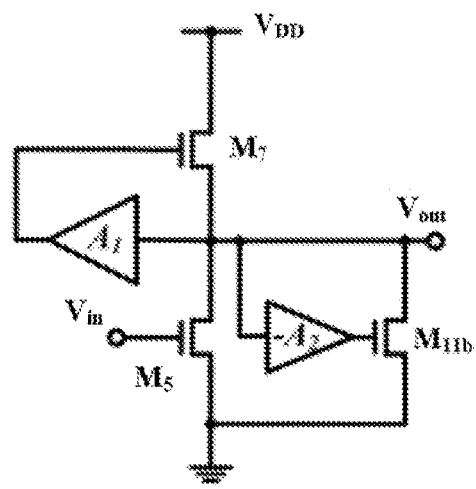
FIG. 2 is a circuit diagram of an auxiliary amplifier in an embodiment of the present disclosure.
Figure 3:
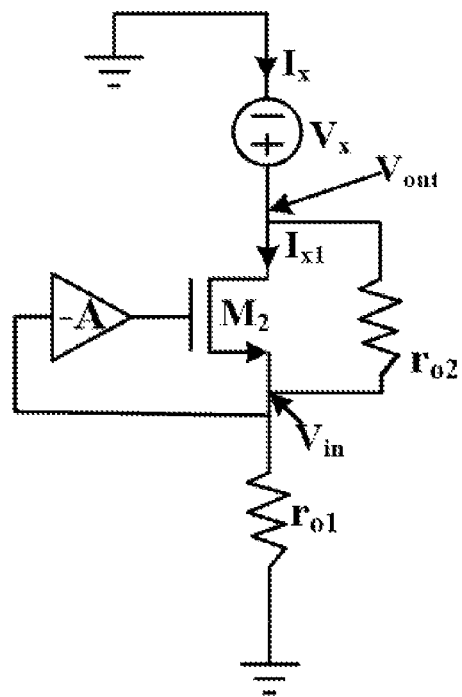
FIG. 3 is a small signal equivalent circuit of an operational amplifier in an embodiment of the present disclosure.

As shown in FIG. 1 to FIG. 3, this embodiment provides an operational amplifier based on a metal-oxide TFT, including:

Referring to FIG. 2, an auxiliary amplifier, including two first circuits in mutual symmetry, and each of the first circuits adopts a two-stage positive feedback structure, including a fifth transistor $M_5$, a seventh transistor $M_7$, an eleventh transistor $M_{11b}$, a first amplifying unit, and a second amplifying unit, with a gate of the fifth transistor $M_5$ serving as an input end of the operational amplifier, a drain of the fifth transistor $M_5$ being connected to a source of the seventh transistor $M_7$, a drain of the eleventh transistor $M_{11b}$, an input end of the first amplifying unit and an input end of the second amplifying unit, an output end of the first amplifying unit being connected to a gate of the seventh transistor $M_7$, and an output end of the second amplifying unit being connected to a gate of the eleventh transistor $M_{11b}$.

Referring to FIG. 3, a bootstrap gain-increasing amplifier, including two second circuits in mutual symmetry, and each of the second circuits includes a first transistor $M_{1b}$, a second transistor $M_{2b}$, and a current source unit with a bootstrap structure, with a gate of the second transistor $M_{2b}$ being connected to the drain of the fifth transistor $M_5$, the drain of the second transistor $M_{2b}$ being connected to the current source unit, a source of the second transistor $M_{2b}$ being connected to a drain of the first transistor $M_{1b}$ and the gate of the fifth transistor $M_5$, a source of the first transistor $M_{1b}$ being grounded, and the drain of the second transistor $M_{2b}$ serving as an output end of the operational amplifier.

Referring to FIG. 1, further, in a preferred implementation, the current source unit includes a third transistor $M_{3b}$, a fourth transistor $M_{4b}$, and a capacitor $C_2$;

a gate and a drain of the fourth transistor $M_{4b}$ are both connected to a power source, a source of the fourth transistor $M_{4b}$ is connected to a gate of the third transistor $M_{3b}$, a drain of the third transistor $M_{3b}$ is connected to the power source, a source of the third transistor $M_{3b}$ is connected to the drain of the second transistor $M_{2b}$, and the capacitor $C_2$ is connected between the gate and the source of the third transistor $M_{3b}$ in parallel.

The capacitor $C_2$ is a bootstrap capacitor that provides a gate-source voltage for the third transistor $M_{3b}$ and effectively improves an output potential, thereby improving an output voltage swing.

Referring to FIG. 1, further, in a preferred implementation, the first circuit further includes a tenth transistor $M_{10b}$, a twelfth transistor Mica and a thirteenth transistor $M_{13}$;

a gate of the tenth transistor $M_{10b}$ is connected to the drain of the fifth transistor $M_5$, a drain of the tenth transistor $M_{10b}$ is connected to the gate of the eleventh transistor $M_{11b}$ and a gate of the twelfth transistor $M_{11a}$, a drain of the twelfth transistor $M_{11a}$ is connected to a source of the thirteenth transistor $M_{13}$, a gate and a drain of the thirteenth transistor $M_{13}$ are both connected to the power source, the tenth transistor $M_{10b}$, the twelfth transistor $M_{11a}$ and the thirteenth transistor $M_{13}$ constitute the first amplifying unit, the drain of the twelfth transistor $M_{11a}$ serves as the output end of the first amplifying unit, and the tenth transistor $M_{10b}$ constitutes the second amplifying unit.

Referring to FIG. 1, further, in a preferred implementation, the auxiliary amplifier further includes a ninth transistor $M_9$ and a fourteenth transistor $M_{14}$, and the ninth transistor $M_9$ and the fourteenth transistor $M_{14}$ both serve as current sources;

a drain of the ninth transistor $M_9$ is connected to a source of the fifth transistor $M_5$, a gate of the ninth transistor $M_9$ is connected to a first bias voltage $V_{b1}$, and a source of the ninth transistor $M_9$ is grounded;

a drain of the fourteenth transistor $M_{14}$ is connected to a source of the eleventh transistor $M_{11b}$ and a source of the twelfth transistor $M_{11a}$, a gate of the fourteenth transistor $M_{14}$ is connected to a second bias voltage $V_{b2}$, and a source of the fourteenth transistor $M_{14}$ is grounded.

Referring to FIG. 1, further, in a preferred implementation, a gate of the first transistor $M_{1b}$ is connected to the first bias voltage.

Figure 4:
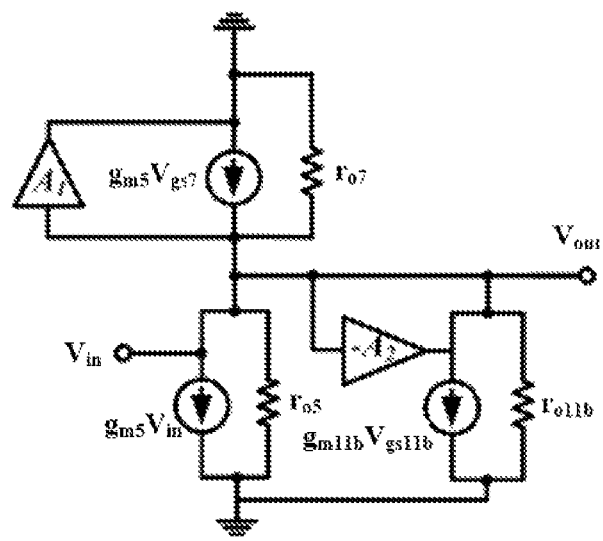
FIG. 4 is a small signal equivalent circuit of an auxiliary amplifier in an embodiment of the present disclosure.

The following describes the working principle of the above operational amplifier in detail with reference to FIG. 1 and FIG. 3 to FIG. 4.

The operational amplifier is as shown in FIG. 1, and the circuit can be divided into two stages, i.e., the auxiliary amplifier in the first stage and the bootstrap gain-increasing amplifier in the second stage. The auxiliary amplifier includes $M_5$ to $M_{13}$. The bootstrap gain-increasing amplifier includes $M_{1a}$ to $M_{4a}$ and $M_{1b}$ to $M_{4b}$.

By adjusting the bias voltages $V_{b1}$ (i.e., the first bias voltage) and $V_{b2}$ (i.e., the second bias voltage), all the TFTs (i.e., transistors) of the operational amplifier work in a saturation region. As shown in FIG. 3, a small signal equivalent circuit of the operational amplifier is provided, and to simplify the calculation, a single-ended input and single-ended output model is selected. According to the kvl, a current $i_x$ is:

$$i_x = \frac{V_{in}}{r_{o1}} \quad (3-1)$$

a current $i_{x1}$ is (where $gM_2$ represents a transconductance of the $M_2$ and $-A$ represents a gain of the auxiliary amplifier):

$$i_{x1} = -g_{m2}(A+1)V_{in} \quad (3-2)$$

an output voltage $V_{out}$ is:

$$V_{out} = (i_x - i_{x1})r_{o2} + V_{in} \quad (3-3)$$

Therefore, a gain($A_V$) of the operational amplifier is:

$$A_v = \left[\frac{1}{r_{o1}} + g_{m2}(A+1)\right]r_{o2} + 1 \quad (3-4)$$

It can be obtained from Formula (3-4) that the operational amplifier may acquire a high gain by increasing the gain of the auxiliary amplifier. To increase the voltage gain of the auxiliary amplifier, the two-stage positive feedback structure is adopted. The first stage includes $M_{10a}$, $M_{11a}$, $M_{12}$, and $M_{13}$. The second stage includes $M_{10b}$ and $M_{11b}$. Different from a conventional structure that only adopts the first stage of positive feedback, to enhance positive feedback, the two pull-down devices $M_{10b}$ and $M_{11b}$ are added to the auxiliary amplifier herein. Therefore, when an input signal increases, $M_{10b}$ and Min may increase discharge currents of $M_5$ and $M_6$, and then increase the gain of the auxiliary amplifier.

Referring to FIG. 4, an equivalent output impedance of the auxiliary amplifier is:

$$R_L = \frac{1}{g_{m7}(1-A_1)} // r_{o7} // \frac{1}{g_{m11b}(-A_2)} // r_{o_{11b}}$$

The gain is:

$$A_V = g_{m5}\left[\frac{1}{g_{m7}(1-A_1)} // r_{o7} // \frac{1}{g_{m11b}(-A_2)} // r_{o_{11b}} // r_{o5}\right].$$

References are directly made to this formula of the gain. By adding a negative resistance, the gain is increased, i.e., $M_{10b}$ and $M_{11b}$ increase discharge currents of $M_5$ and $M_6$.

Simulating results of the operational amplifier are as below.

This embodiment adopts the metal-oxide TFT and adopts a 13 V supply voltage. Hspice is used to simulate a specific process, and adjust parameters and optimize indexes according to structure.

Sizes of $M_{1a}$ to $M_{2b}$ are:

$$\left(\frac{W}{L}\right)_1 = \frac{2I_X}{\mu_n C_{ox}(V_{b1} - V_{th})^2} \quad (4-1)$$

$$\left(\frac{W}{L}\right)_2 = \frac{2I_X}{\mu_n C_{ox}(V_{gs} - V_{th})^2} \quad (4-2)$$

Sizes of $M_5$ and $M_6$ are:

$$\left(\frac{W}{L}\right)_5 = \left(\frac{W}{L}\right)_6 = \frac{2I_{M5}}{\mu_n C_{ox}(V_{gs5} - V_{th})^2} \quad (4-3)$$

Sizes of $M_7$ and $M_8$ are:

$$\left(\frac{W}{L}\right)_7 = \left(\frac{W}{L}\right)_8 = \frac{2I_{M7}}{\mu_n C_{ox}(V_{gs7} - V_{th})^2} \quad (4-4)$$

The size of $M_9$ is:

$$\left(\frac{W}{L}\right)_9 = \frac{2I_{M9}}{\mu_n C_{ox}(V_{b1} - V_{th})^2} \quad (4-5)$$

Sizes of $M_{10}$ to $M_{11}$ (setting that devices with the two-stage positive feedback structure have the same size) are:

$$\left(\frac{W}{L}\right)_{10a,b} = \left(\frac{W}{L}\right)_{11a,b} = \frac{2I_{M10a}}{\mu_n C_{ox}(V_{gs10a} - V_{th})^2} \quad (4-6)$$

Sizes of $M_{12}$ to $M_{13}$ are (where $IM_{12}=IM_{10a}$):

$$\left(\frac{W}{L}\right)_{12} = \left(\frac{W}{L}\right)_{13} = \frac{2I_{M10a}}{\mu_n C_{ox}(V_{gs12}-V_{th})^2} \quad (4\text{-}7)$$

The size of $M_{14}$ (where $IM_7=IM_5+IM_{10a}$) is:

$$\left(\frac{W}{L}\right)_{14} = \frac{2I_{M7}}{\mu_n C_{ox}(V_{gs7}-V_{th})^2} \quad (4\text{-}8)$$

According to the above formula, the size optimization index is repeatedly adjusted. The resulting amplifier size is shown in Table 1.

TABLE 1

| | Transistor size (μm) | Capacitance (pf) |
|---|---|---|
| Operational amplifier | $M_{1a}$-$M_{1b}$: 10/10; $M_{2a}$-$M_{2b}$: 70/5; $M_{3a}$-$M_{4b}$: 60/10; $M_5$-$M_6$: 400/5; $M_7$-$M_8$: 50/10; $M_9$: 200/30; $M_{10a}$-$M_{11b}$: 10/10; $M_{12}$-$M_{13}$: 44/10; $M_{14}$: 500/15 | $C_1$-$C_2$: 100 p |

Figure 5:
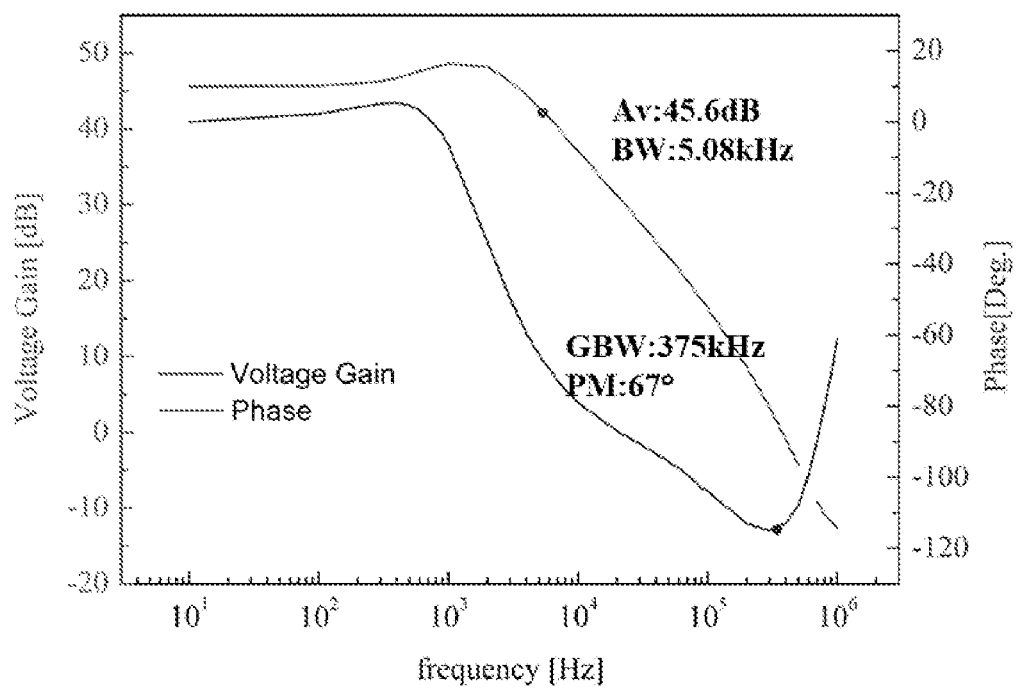
FIG. 5 is a frequency response graph of an operational amplifier in an embodiment of the present disclosure.

As shown in FIG. 5, a frequency response graph of the operational amplifier is provided. When a gain is 45.6 dB, the −3 dB bandwidth is 5.08 kHz. When a unity-gain bandwidth is 375 kHz, a phase margin is 67°.

Table 2 concludes the performance of the operational amplifier and compares the operational amplifier to other TFT operational amplifiers. Compared to existing operational amplifiers, this embodiment is not large enough in circuit bandwidth. However, it can provide relatively high voltage gain, a stable phase margin and a relatively low power consumption. In Table 2, circuits [1] to [5] are the existing operational amplifiers.

TABLE 2

| Circuit | [1] | [3] | [4] | [5] | This Work |
|---|---|---|---|---|---|
| Technology | IZO TFT | a-IGZO TFT | a-IGZO TFT | Metal-oxide TFT | ITO ZnO TFT |
| DC Supply Voltage [V] | 12 | 5 | 6 | 15 | 13 |
| Open-loop gain [dB] | 21.68 | 22.5 | 19 | 29.54 | 45.6 |
| BW [kHz] | — | 5.6 | 25 | 9.33 | 5.08 |
| GBW [kHz] | 125 | 31 | 330 | 180.2 | 375 |
| PM [Deg.] | — | — | 70 | −21.5 | 67 |
| DC Power [mW] | — | 0.16 | 6.78 | 5.07 | 1.365 |

In conclusion, the operational amplifier of this embodiment has the following beneficial effects.

(1) A TFT operational amplifier circuit having a high gain and a stable phase margin is implemented using a bootstrap gain-increasing technology.

(2) The auxiliary amplifier adopts the two-stage positive feedback structures to further improve a voltage gain.

This embodiment further provides a design method, including the following steps.

At step S1: Obtain process parameters of transistors, and calculate a width-to-length ratio of all the transistors according to the process parameters.

At step S2: Adjust a voltage value of bias voltages so as to make all the transistors work in a saturation region.

At step S3: Simulate the operational amplifier, and optimize and adjust the width-to-length ratio parameter of the transistors according to the simulation result.

The method of this embodiment has a one-to-one correspondence to the above operational amplifier, and thus has the corresponding beneficial effects of the embodiment of the above operational amplifier.

In some optional embodiments, functions/operations mentioned in a block diagram may not occur in accordance with an order indicated in an operation chart. For example, depending on involved functions/operations, two blocks shown in succession may actually be performed substantially at the same time or may sometimes be executed in reverse order. In addition, the embodiments present and described in a flowchart of the present disclosure are provided by examples, and are intended to give a more comprehensive understanding of technologies. The method disclosed is not limited to operations and logical flows presented herein. Optional embodiments are predictable in which the order of the various operations is changed and in which sub-operations described as part of larger operations are performed independently.

Furthermore, although the present disclosure has been described in the context of functional modules, it should be understood that one or more of the described functions and/or features may be integrated into a single physical apparatus and/or software module, or that one or more functions and/or features may be implemented in separate physical apparatuses or software modules unless otherwise noted. It can also be understood that a detailed discussion of the actual implementation of each module is not necessary for an understanding of the present disclosure. Rather, the actual implementation of the various functional modules in the apparatus disclosed herein will be understood within the conventional techniques of the engineer in view of their attributes, functions, and internal relationships. Accordingly, those skilled in the art can implement the present disclosure as set forth in the claims can be practiced using ordinary techniques without undue experimentation. It can also be understood that the specific concepts disclosed are illustrative only and are not intended to limit the scope of the present disclosure, and the scope of the present disclosure is determined by the full scope of the appended claims and equivalent solutions thereof.

The functions, if implemented in the form of software functional units and sold or used as stand-alone products, may be stored in a computer-readable storage medium. Based on this understanding, the technical solution of the present disclosure in essence or the part that contributes to the existing technology or part of the technical solution can be embodied in the form of a software product. The computer software product is stored in a storage medium and includes several instructions for causing a computer device (e.g., a personal computer, a server or a network device) to perform all or some steps of the method of the various embodiments of the present disclosure. The aforementioned storage medium includes: a USB flash disk, a mobile hard disk, a read-only memory (ROM), a random access memory (RAM), a magnetic disk or an optical disk and other various media capable of storing program codes.

Logic and/or steps shown in the flowchart or otherwise described herein in other ways may, for example, be deemed as an ordered listing of executable instructions for realizing logical functions, and may be specifically embodied in any computer-readable medium for use by or in connection with an instruction execution system, apparatus, or device (e.g., a computer-based system, a system that includes a processor, or other systems that may take and execute instructions from the instruction execution system, apparatus, or device). For this specification, a "computer-readable medium" may be any apparatus that can contain, store, communicate, propagate, or transport a program for use by or in connection with the instruction execution system, apparatus, or device.

More specific examples (a non-exhaustive listing) of the computer-readable medium include the following: an electrical connection portion (electronic apparatus), a portable computer cartridge (magnetic apparatus), a random access memory (RAM), a read-only memory (ROM), an erasable programmable read-only memory (EPROM or flash ROM), an optical fiber apparatus, and a portable compact disc read-only memory (CDROM) having one or more wiring lines. In addition, the computer-readable medium may even be paper or another suitable medium upon which the program can be printed, as the program may be electronically obtained, for example by optically scanning the paper or other medium and then performing editing, interpreting, or processing in other suitable manners if necessary, and then stored in computer memory.

It should be understood that all parts of the present disclosure may be implemented in hardware, software, firmware, or a combination thereof. In the embodiments described above, the steps or method may be implemented in software or firmware stored in a memory and executed by a suitable instruction execution system. For example, if implemented in hardware, as in another embodiment, it may be implemented using any one or a combination of the following techniques known in the art: discrete logic circuits with logic gates for implementing logic functions on data signals, application-specific integrated circuits with appropriate combinational logic gates, programmable gate arrays (PGAs), field-programmable gate arrays (FPGAs), etc.

In the foregoing description of this specification, reference to the description of the terms "one implementation/embodiment", "another implementation/embodiment", or "some implementations/embodiments", etc. means that particular features, structures, materials, or characteristics described in connection with the embodiments or examples are included in at least one embodiment or example of the present disclosure. In this specification, schematic representations of the above terms do not necessarily refer to the same implementation or example. Furthermore, the particular features, structures, materials, or characteristics described may be combined in a suitable manner in any one or more implementations or examples.

Although the implementations of the present disclosure have been illustrated and described, it should be understood by those of ordinary skill in the art that various changes, modifications, replacements and variations can be made to these embodiments without departing from the principle and purpose of the present disclosure and the scope of the present disclosure is defined by the claims and equivalents.

The preferred implementations of the present disclosure are described in detail as above, but the present disclosure is not limited to the above embodiments. Those skilled in the art can also make various equivalent variations or replacements without departing from the spirit of the present disclosure, and such equivalent variations or replacements are all included in the scope defined by the claims of the present application.

What is claimed is:

1. An operational amplifier based on a metal-oxide thin-film transistor (TFT), comprising:
    an auxiliary amplifier comprising two first circuits in mutual symmetry, wherein each of the two first circuits is configured to adopt a two-stage positive feedback structure and comprises a fifth transistor, a seventh transistor, an eleventh transistor, a first amplifying unit, and a second amplifying unit, with a gate of the fifth transistor serving as an input end of the operational amplifier, a drain of the fifth transistor being connected to a source of the seventh transistor, a drain of the eleventh transistor, an input end of the first amplifying unit and an input end of the second amplifying unit, an output end of the first amplifying unit being connected to a gate of the seventh transistor, and an output end of the second amplifying unit being connected to a gate of the eleventh transistor;
    a bootstrap gain-increasing amplifier comprising two second circuits in mutual symmetry, wherein each of the two second circuits comprises a first transistor, a second transistor, and a current source unit with a bootstrap structure, a gate of the second transistor being connected to the drain of the fifth transistor, a drain of the second transistor being connected to the current source unit, a source of the second transistor being connected to a drain of the first transistor and the gate of the fifth transistor, a source of the first transistor being grounded, and the drain of the second transistor serving as an output end of the operational amplifier.

2. The operational amplifier of claim 1, wherein the current source unit comprises a third transistor, a fourth transistor, and a capacitor;
    wherein a gate and a drain of the fourth transistor are both connected to a power source, a source of the fourth transistor is connected to a gate of the third transistor, a drain of the third transistor is connected to the power source, a source of the third transistor is connected to the drain of the second transistor, and the capacitor is connected between the gate and the source of the third transistor in parallel.

3. The operational amplifier of claim 1, wherein the first circuit further comprises a tenth transistor, a twelfth transistor, and a thirteenth transistor;
    wherein a gate of the tenth transistor is connected to the drain of the fifth transistor, a drain of the tenth transistor is connected to the gate of the eleventh transistor and a gate of the twelfth transistor, a drain of the twelfth transistor is connected to a source of the thirteenth transistor, a gate and a drain of the thirteenth transistor are both connected to the power source, the tenth transistor, the twelfth transistor and the thirteenth transistor constitute the first amplifying unit, the drain of the twelfth transistor serves as the output end of the first amplifying unit, and the tenth transistor constitutes the second amplifying unit.

4. The operational amplifier of claim 1, wherein the auxiliary amplifier further comprises a ninth transistor and a fourteenth transistor, and the ninth transistor and the fourteenth transistor both serve as current sources;
    wherein a drain of the ninth transistor is connected to a source of the fifth transistor, a gate of the ninth transistor is connected to a first bias voltage, and a source of the ninth transistor is grounded;
    a drain of the fourteenth transistor is connected to a source of the eleventh transistor and a source of the twelfth transistor, a gate of the fourteenth transistor is connected to a second bias voltage, and a source of the fourteenth transistor is grounded.

5. The operational amplifier of claim 4, wherein a gate of the first transistor is connected to the first bias voltage.

6. A chip, comprising the operational amplifier of claim 1.

7. A chip, comprising the operational amplifier of claim 2.

8. A chip, comprising the operational amplifier of claim 3.

9. A chip, comprising the operational amplifier of claim 4.

10. A chip, comprising the operational amplifier of claim 5.

11. A design method for an operational amplifier based on a metal-oxide thin-film transistor (TFT), applied to the operational amplifier of claim 1, comprising:

obtaining a plurality of process parameters of a plurality of transistors, and calculating a width-to-length ratio of all the plurality of transistors according to the plurality of process parameters;

adjusting a voltage value of bias voltage to make all the plurality of transistors operate in a saturation region;

simulating the operational amplifier and thereby obtaining a simulation result, and optimizing and adjusting the width-to-length ratio parameter of the plurality of transistors according to the simulation result.

\* \* \* \* \*